(12) United States Patent
Liao et al.

(10) Patent No.: US 12,336,256 B2
(45) Date of Patent: Jun. 17, 2025

(54) SEMICONDUCTOR STRUCTURE WITH METAL ION CAPTURE LAYER

(71) Applicant: Taiwan Semiconductor Manufacturing Company, Ltd., Hsinchu (TW)

(72) Inventors: Yi Ting Liao, Changhua (TW); Chao-Chi Chen, Tainan (TW); Bo-Wei Chen, Kaohsiung (TW); Shi Sheng Hu, Tainan (TW); Shun Chi Tsai, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 421 days.

(21) Appl. No.: 17/720,481

(22) Filed: Apr. 14, 2022

(65) Prior Publication Data
US 2023/0335603 A1   Oct. 19, 2023

(51) Int. Cl.
| H10D 64/00 | (2025.01) |
| H01L 21/28 | (2006.01) |
| H10D 64/66 | (2025.01) |
| H10D 84/01 | (2025.01) |
| H10D 84/03 | (2025.01) |
| H10D 84/85 | (2025.01) |

(52) U.S. Cl.
CPC ..... *H10D 64/118* (2025.01); *H01L 21/28088* (2013.01); *H10D 64/667* (2025.01); *H10D 84/0177* (2025.01); *H10D 84/0193* (2025.01); *H10D 84/038* (2025.01); *H10D 84/853* (2025.01)

(58) Field of Classification Search
None
See application file for complete search history.

(56) References Cited

U.S. PATENT DOCUMENTS

| 2013/0203231 | A1* | 8/2013 | Fitzsimmons | ......... C09K 13/00 |
| | | | | 438/585 |
| 2016/0351563 | A1* | 12/2016 | Chen | .................. H10D 84/0151 |
| 2019/0057861 | A1* | 2/2019 | Liang | ................ H01L 21/31055 |
| 2019/0103283 | A1* | 4/2019 | Wu | ...................... H01L 21/3212 |
| 2019/0273145 | A1* | 9/2019 | Chiu | ..................... H10D 84/038 |
| 2021/0375698 | A1 | 12/2021 | Cheng | |
| 2021/0376133 | A1 | 12/2021 | Hung et al. | |
| 2024/0136191 | A1 | 4/2024 | Hung et al. | |

FOREIGN PATENT DOCUMENTS

| CN | 111463260 A | * | 7/2020 | .......... H01L 29/0611 |
| TW | 202032638 A | | 9/2020 | |
| TW | 202145350 A | | 12/2021 | |

* cited by examiner

*Primary Examiner* — Scott B Geyer
(74) *Attorney, Agent, or Firm* — Sterne, Kessler, Goldstein & Fox P.L.L.C.

(57) ABSTRACT

The present disclosure describes a semiconductor structure with a metal ion capture layer and a method for forming the structure. The method includes forming a first fin structure and a second fin structure on a substrate and forming a first gate structure over the first fin structure and a second gate structure over the second fin structure, where the first gate structure adjoins the second gate structure. The method further includes forming a dielectric layer on the first and second gate structures, removing a portion of the dielectric layer above an adjoining portion of the first and second gate structures to form an opening, and forming a metal ion capture layer in the opening.

20 Claims, 16 Drawing Sheets

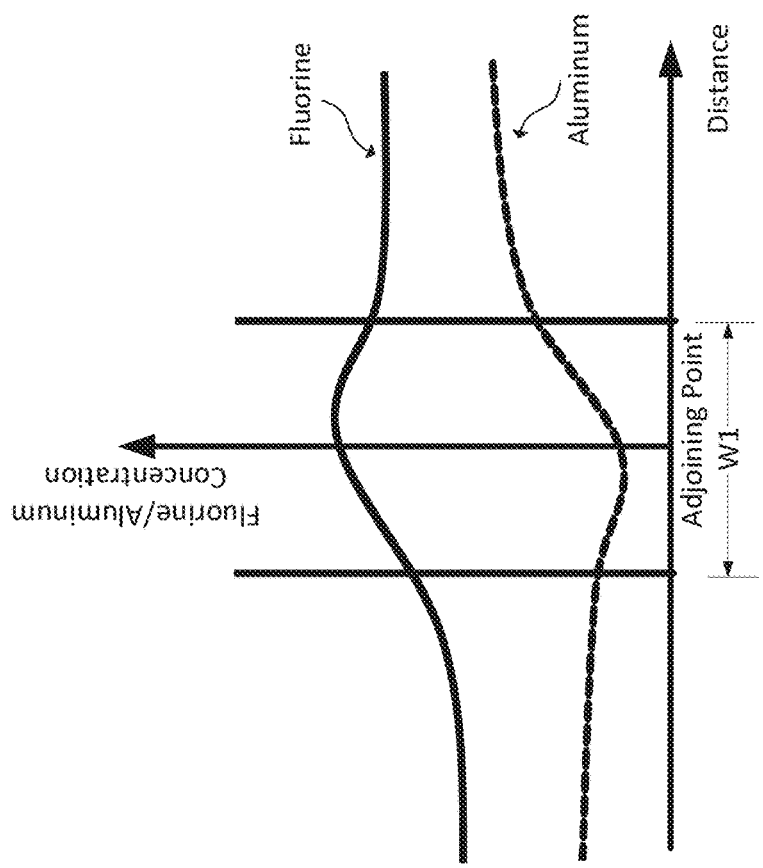
FIG. 1C
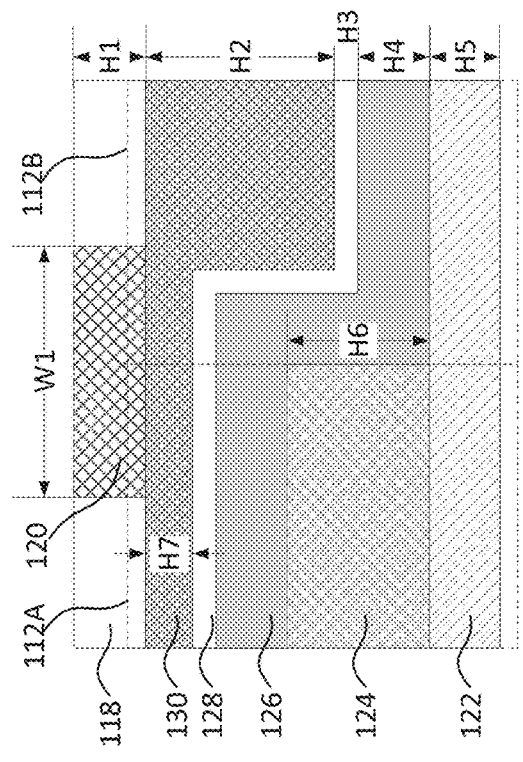
FIG. 1B
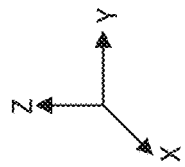

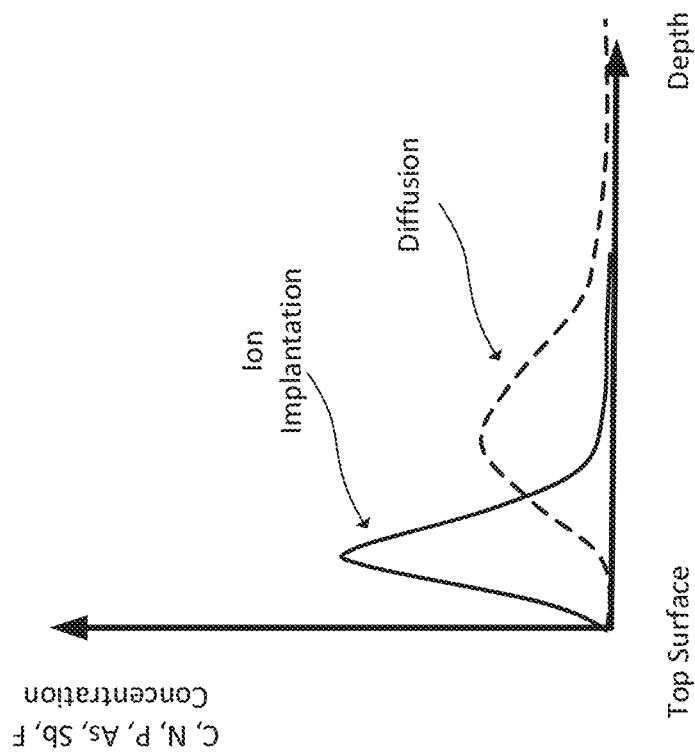
FIG. 1F
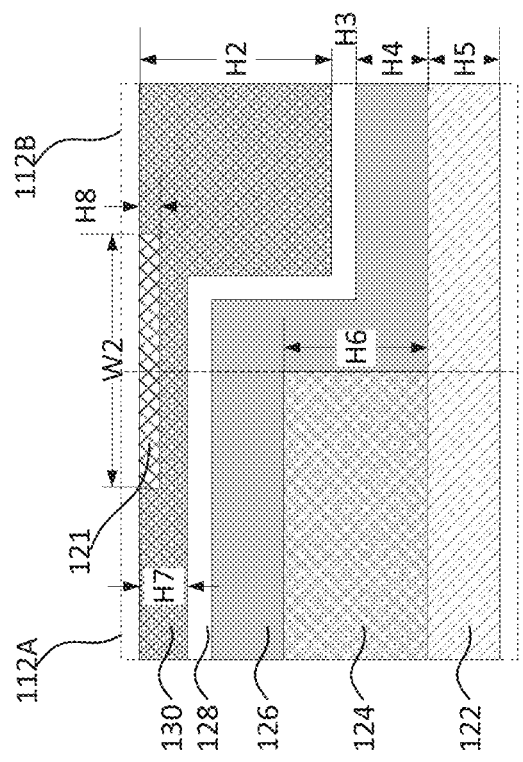
FIG. 1E
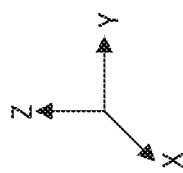

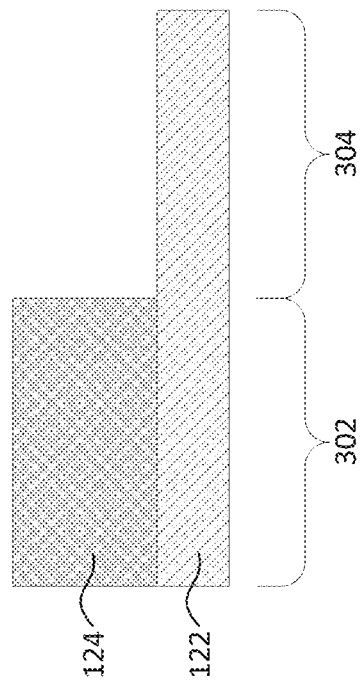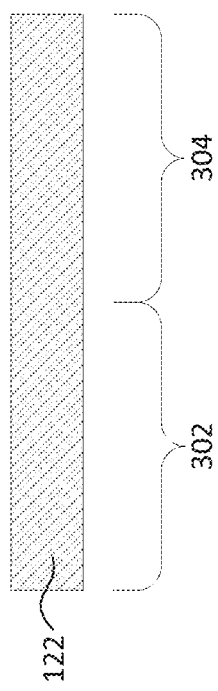
FIG. 13
FIG. 12

SEMICONDUCTOR STRUCTURE WITH METAL ION CAPTURE LAYER

BACKGROUND

With advances in semiconductor technology, there has been increasing demand for higher storage capacity, faster processing systems, higher performance, and lower costs. To meet this demand, the semiconductor industry continues to scale down the dimensions of semiconductor devices and increase the density of transistors. Metal gates with different work function metals (WFMs) can adjoin each other in the scaled-down semiconductor devices.

BRIEF DESCRIPTION OF THE DRAWINGS

Aspects of the present disclosure are best understood from the following detailed description when read with the accompanying figures.

FIG. 1B illustrates a cross-sectional view of the semiconductor structure illustrated in FIG. 1A along line A-A, in accordance with some embodiments.

FIG. 1C illustrates concentration profiles of different ions with respect to width in a semiconductor structure with a metal ion capture layer, in accordance with some embodiments.

FIG. 1E illustrates a cross-sectional view of the semiconductor structure illustrated in FIG. 1D along line B-B, in accordance with some embodiments.

FIG. 1F illustrates concentration profiles of ions formed by different methods with respect to depth in a semiconductor structure with a metal ion capture layer, in accordance with some embodiments.

FIGS. 12-18 illustrate cross-sectional views of a semiconductor structure with a metal ion capture layer at various stages of its fabrication process, in accordance with some embodiments.

DETAILED DESCRIPTION

Figure 1A:
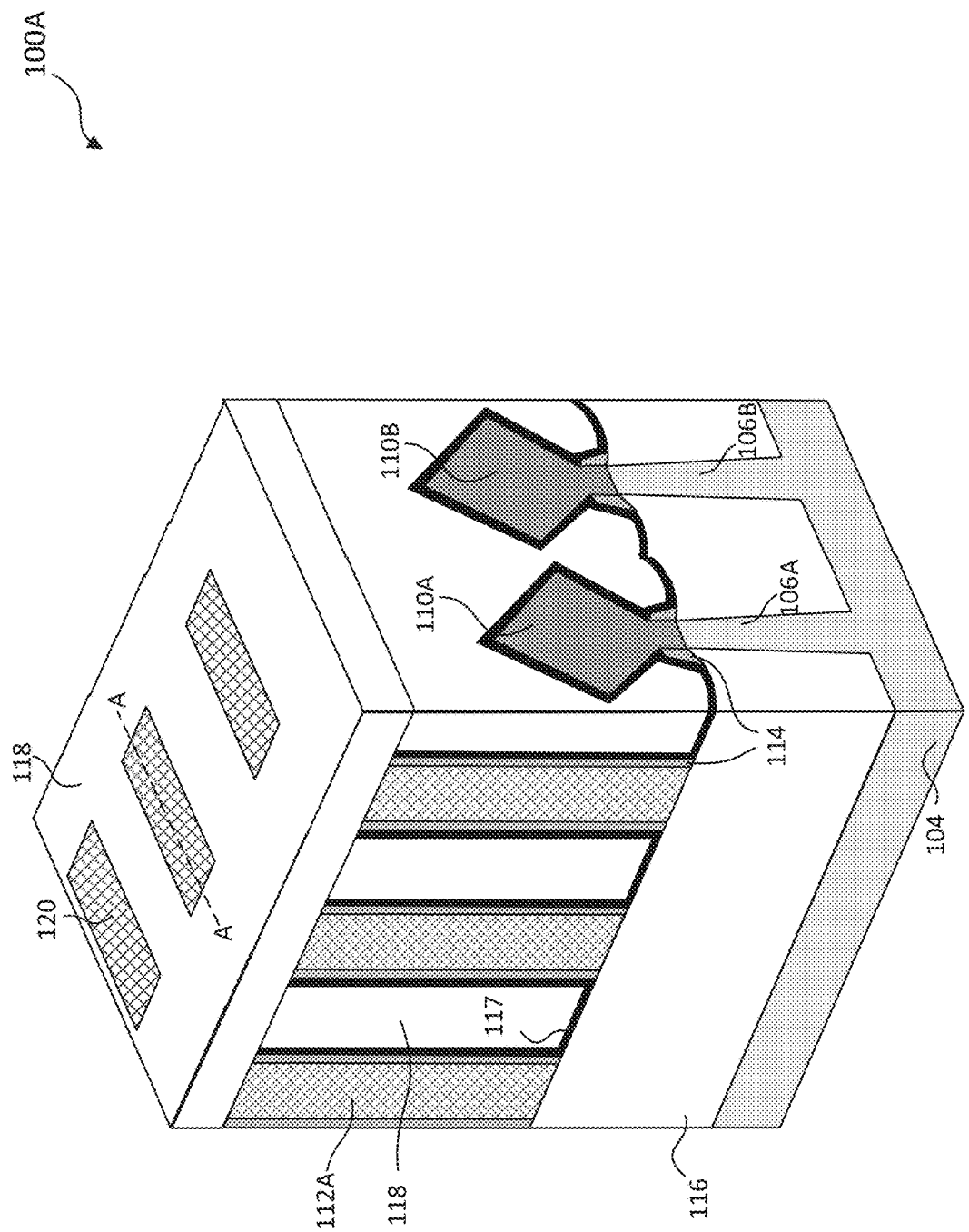
FIG. 1A illustrates an isometric view of a semiconductor structure with a metal ion capture layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) and gate-all-around (GAA) FETs can be patterned by any suitable method. For example, the fins can be patterned using one or more photolithography processes, including double-patterning and multi-patterning processes. Double-patterning and multi-patterning processes can combine photolithography and self-aligned processes, allowing patterns to be created that have, for example, pitches smaller than what is otherwise obtainable using a single, direct photolithography process. For example, a sacrificial layer can be formed over a substrate and patterned using a photolithography process. Spacers can be formed alongside the patterned sacrificial layer using a self-aligned process. The sacrificial layer can be removed, and the remaining spacers can be used to pattern the fins.

The discussion of elements in FIGS. 1A, 1B, 1D, 1E, 1G-1I, 3-10, and 12-18 with the same annotations applies to each other, unless mentioned otherwise.

As the semiconductor industry continues to scale down the dimensions of semiconductor devices, metal gates with different work function metals (WFMs) can be designed to adjoin each other to decrease device footprint. Different WFMs can have different concentrations of the same metal. For example, some WFMs can have a higher concentration of aluminum (Al) or are aluminum-rich. A WFM alloy can be considered aluminum-rich if the WFM alloy contains more than about 10% of Al in atomic percentage (at %). Some WFMs can have a lower concentration of Al or are Al-free. When WFMs with different concentrations of the same metal adjoin, the metal can diffuse from the higher-concentration side to the lower-concentration side. The metal drifting and/or migration can cause leakage current in the metal gates and reduce device performance.

The present disclosure provides example FET structures (e.g., GAA FETs, finFETs, or planar FETs) with metal ion capture layers in a semiconductor device and/or in an integrated circuit (IC) and example methods for fabricating the same. In some embodiments, a metal ion capture layer can be formed in an interlayer dielectric (ILD) layer above adjoining metal gates with different WFMs. An opening can be formed in the ILD layer by a dry etch process or a wet etch process. The metal ion capture layer can be formed by depositing a fluorine-rich oxide layer in the opening with a physical vapor deposition (PVD) process or a chemical vapor deposition (CVD) process. An oxide layer can be considered fluorine-rich if the oxide layer contains more than about 10% of fluorine (F) in at %. The F in the fluorine-rich oxide layer can react with metal ions diffused from the higher-concentration side of the WFMs to the lower-concentration side, therefore reducing the metal drifting and/or migration. For example, F and Al can react to form aluminum fluoride ($AlF_3$). The reaction can take place while the fluorine-rich oxide layer is being deposited. In some embodiments, after the reaction, the fluorine-rich oxide layer can remain in the ILD layer. In some embodiments, the fluorine-rich oxide layer can be removed after the reaction.

In some embodiments, a metal ion capture layer can be formed in a metal fill layer of adjoining metal gates with different WFMs. In some embodiments, the metal ion capture layer can be formed by diffusing carbon (C), nitrogen (N), phosphorous (P), arsenic (As), antimony (Sb), F, and combinations thereof in the metal fill layer by a thermal diffusion process, an atomic layer deposition (ALD) diffusion process, or a wet diffusion process. In some embodiments, the metal ion capture layer can be formed by implanting C, N, P, As, Sb, F, and combinations thereof in the metal fill layer by an ion implantation process. In some embodiments, the ion implantation process can be plasma enhanced. The area to be diffused or implanted can be defined by a mask layer, such as a photoresist layer. The C, N, P, As, Sb, F, and combinations thereof in the metal ion capture layer can react with metal ions diffused from the higher-concentration side of the WFMs to the lower-concentration side, therefore reducing the metal drifting and/or migration. For example, C, N, P, As, Sb, F, and Al can react to form aluminum compounds. The reaction can take place while the metal ion capture layer is being formed. In some embodiments, after the reaction, the metal ion capture layer can remain in the metal fill layer. In some embodiments, the metal ion capture layer can be removed after the reaction. The metal ion capture layer can reduce metal drifting and/or migration, decrease leakage current in the adjoining metal gates with different WFMs and improve device performance.

Figure 1D:
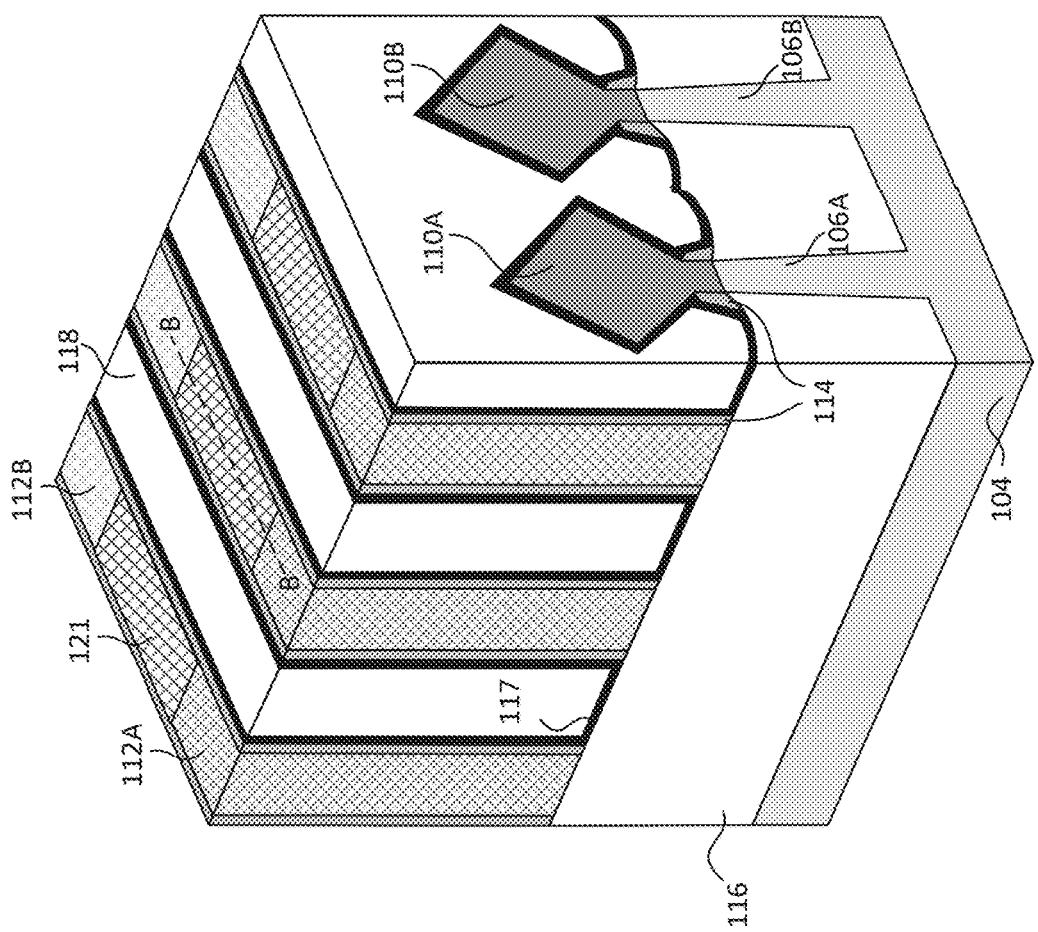
FIG. 1D illustrates an isometric view of another semiconductor structure with a metal ion capture layer, in accordance with some embodiments.
Figure 1H:
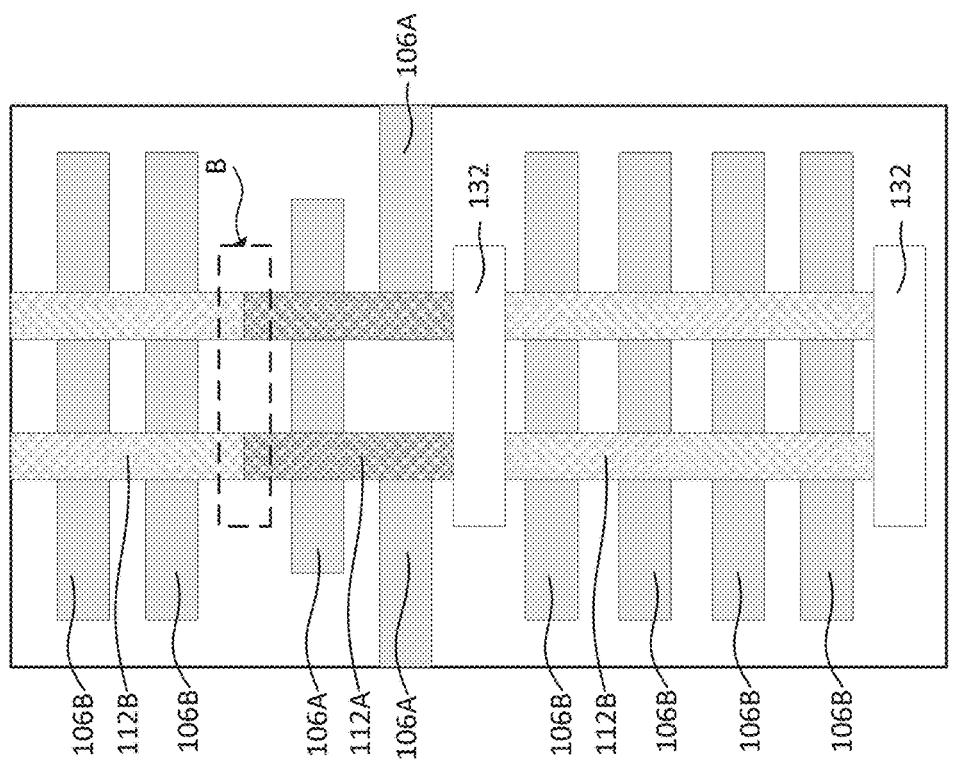
FIGS. 1G-1I illustrate metal gate layouts in semiconductor devices, in accordance with some embodiments.
Figure 1G:
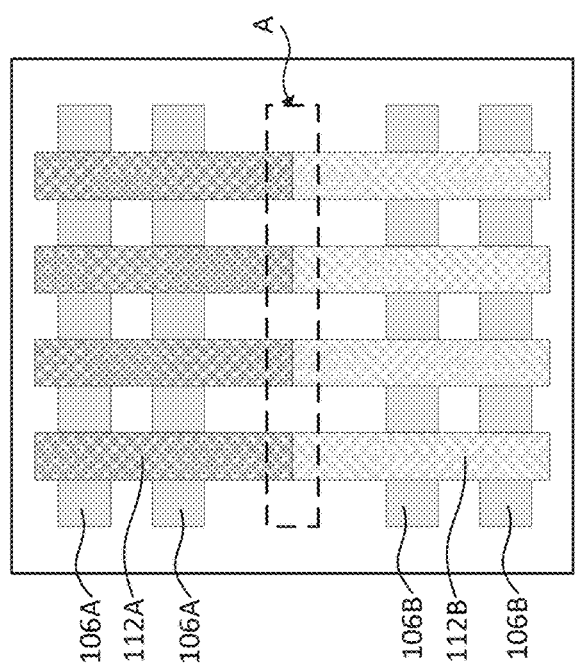
Figure 1I:
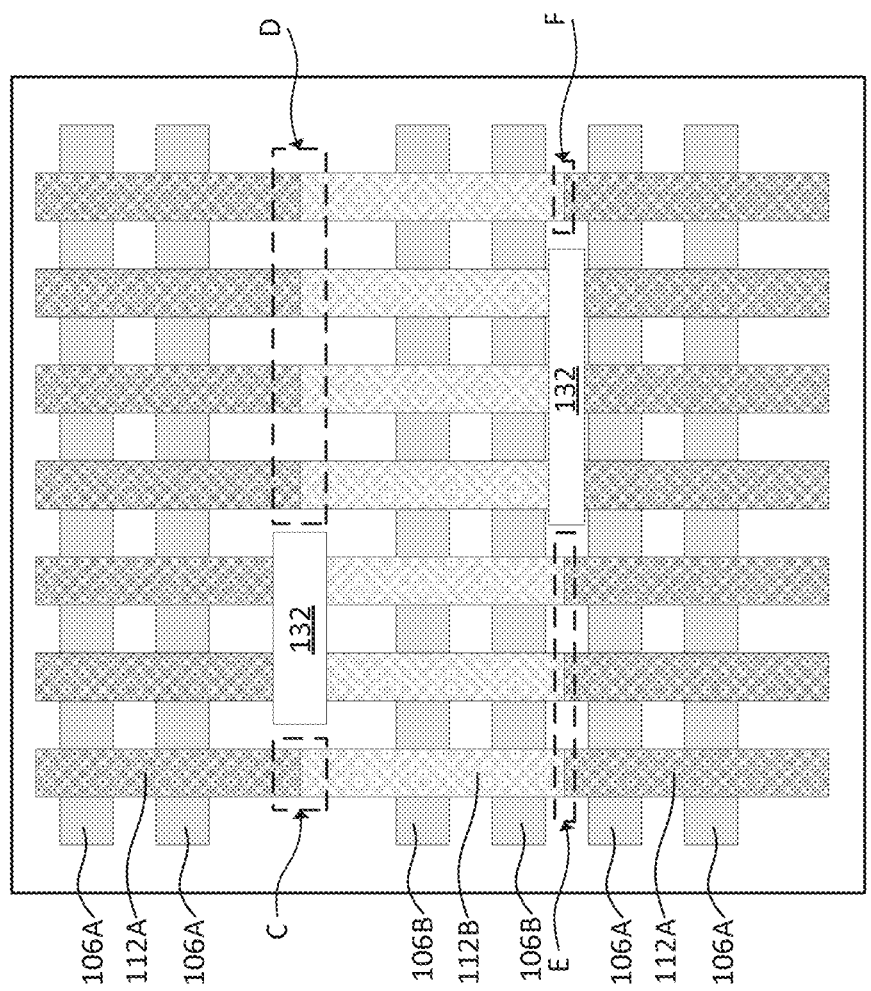
Figure 1I:
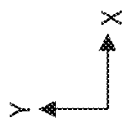

According to some embodiments, FIG. 1A illustrates an isometric view of a FET 100A and FIG. 1D illustrates an isometric view of a FET 100D. In some embodiments, FETs 100A and 100D can represent a finFET or a GAA FET. In some embodiments, FETs 100A and 100D can include n-type FET (NFET) adjoining p-type FET (PFET) and the discussion of FETs 100A and 100D applies to both NFET and PFET, unless mentioned otherwise. FIG. 1B illustrates a cross-sectional view of FET 100A along line A-A showing relative positions between metal ion capture layer 120 and ILD layer 118. FIG. 1E illustrates a cross-sectional view of FET 100D along line B-B showing relative positions between metal ion capture layer 121 and metal fill layer 130. FIGS. 1G-1I illustrate metal gate layouts in semiconductor devices. The discussion of elements in FIGS. 1A, 1B, 1D, 1E, and 1G-1I with the same annotations applies to each other, unless mentioned otherwise.

Referring to FIGS. 1A and 1D, FETs 100A and 100D can be formed on a substrate 104. There can be other FETs and/or structures (e.g., isolation structures) formed on substrate 104. Substrate 104 can be a semiconductor material, such as silicon (Si), germanium (Ge), silicon germanium (SiGe), a silicon-on-insulator (SOI) structure, and combinations thereof. Further, substrate 104 can be doped with p-type dopants, such as boron (B), indium (In), aluminum (Al), and gallium (Ga), or n-type dopants, such as P and As.

Referring to FIGS. 1A, 1D, and 1G-1I, FETs 100A and 100D can include n-type fin structures 106A and p-type fin structures 106B disposed on substrate 104. N-type fin structures 106A can be doped with n-type dopants, such as P and As. P-type fin structures 106B can be doped with p-type dopants, such as B, In, Al, and Ga. In some embodiments, n-type fin structures 106A and p-type fin structures 106B can include a material similar to substrate 104 and extend along the X-axis. For GAA FETs, n-type fin structures 106A and p-type fin structures 106B can include first-type and second-type nanostructures (not shown in FIGS. 1A, 1D, and 1G-1I). The first-type nanostructures can include a semiconductor material similar to substrate 104. The second-type nanostructures can include a semiconductor material similar to or different from substrate 104. In some embodiments, the second-type nanostructures can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. The second-type nanostructures can be nanosheets or nanowires. The second-type nanostructures can have cross-sections of other geometric shapes, such as circular, elliptical, triangular, and polygonal shapes.

Referring to FIGS. 1A and 1D, FETs 100A and 100D can include p-type source/drain (S/D) regions 110A disposed on portions of n-type fin structures 106A and n-type source/drain (S/D) regions 110B disposed on portions of p-type fin structures 106B. For PFETs, each of S/D regions 110A can include an epitaxially-grown semiconductor material, such as Si and SiGe, and p-type dopants, such as B and other suitable p-type dopants. For NFETs, each of S/D regions 110B can include an epitaxially-grown semiconductor material, such as Si and SiGe, and n-type dopants, such as P and other suitable n-type dopants. A dopant concentration can be in a range from about $1 \times 10^{20}$ atoms/cm$^3$ to about $3 \times 10^{22}$ atoms/cm$^3$ in each of S/D regions 110A and 110B. In some embodiments, S/D regions 110A and 110B can have a depth of about 50 nm to about 70 nm.

Referring to FIGS. 1A, 1D, and 1G-1I, FETs 100A and 100D can include p-type gate structures 112A disposed on n-type fin structures 106A and n-type gate structures 112B (not visible in FIG. 1A) disposed on p-type fin structures 106B. P-type gate structures 112A can have a p-type WFM. A p-type WFM can have a work function between about 4.5 eV and about 5.5 eV. N-type gate structures 112B can have an n-type WFM. An n-type WFM can have a work function between about 3.5 eV and about 4.5 eV. In some embodiments, gate structures 112A and 112B can be multi-layered structures. The multiple layers of gate structures 112A and 112B are not shown in FIGS. 1A and 1D for simplicity.

Referring to FIGS. 1B and 1E, each of gate structures 112A and 112B can include an interfacial oxide (IO) layer (not shown in FIGS. 1B and 1E), a high-k (HK) dielectric layer 122 disposed on the IO layer, and a conductive layer disposed on HK dielectric layer 122. The IO layer can include $SiO_x$, $SiGeO_x$, or germanium oxide ($GeO_x$). HK dielectric layer 122 can include a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). HK dielectric layer 122 can have a thickness H5 between about 1 nm and about 10 nm. The conductive layer can be a multi-layered structure. The conductive layer can include a WFM layer disposed on HK dielectric layer 122 and a metal fill layer 130 on the WFM layer. In some embodiments, n-type gate structures 112B can include an n-type WFM layer 126. N-type WFM layer 126 can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, and combinations thereof. N-type WFM layer 126 can include other metal alloys that have an n-type work function. In some embodiments, p-type gate structures 112A can include a p-type WFM layer 124. P-type WFM layer 124 can include substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and combinations thereof. P-type WFM layer 124 can include other metal alloys that have a p-type work function. In some embodiments, the WFM layer of p-type gate structures 112A can include a stack of the same WFM. For example, the WFM layer of p-type gate structures 112A can include two or more layers of TiN. In some embodiments, the WFM layer of p-type gate structures 112A can include a stack of different WFMs. For example, the WFM layer of p-type gate structures 112A can include p-type WFM layer 124 and n-type WFM layer 126 disposed on p-type WFM layer 124.

For example, as shown in FIGS. 1B and 1E, p-type gate structure 112A can include a WFM stack including p-type WFM layer 124, such as TiN, and n-type WFM layer 126, such as TiAl. N-type gate structure 112B can include n-type WFM layer 126, such as TiAl. P-type WFM layer 124 can have a thickness H6 between about 5 nm and about 50 nm. N-type WFM layer 126 can have a thickness H4 between about 2 nm and about 30 nm. In some embodiments, p-type gate structure 112A and n-type gate structure 112B can include a glue layer 128, such as TiN. Glue layer 128 can increase adhesion of metal fill layer 130 on the WFMs, such as n-type WFM layer 126. Glue layer 128 can have a thickness H3 between about 1 nm and about 10 nm. Metal fill layer 130 can include a suitable conductive material, such as tungsten (W), low-fluorine tungsten (LFW), Ti, silver (Ag), ruthenium (Ru), molybdenum (Mo), copper (Cu), cobalt (Co), Al, iridium (Ir), nickel (Ni), metal alloys, and combinations thereof. Metal fill layer 130 on the side of p-type gate structures 112A can have a thickness H7 between about 2 nm and about 40 nm. Metal fill layer 130 on the side of n-type gate structures 112B can have a thickness H2 between about 5 nm and about 60 nm.

Referring to FIGS. 1A and 1D, FETs 100A and 100D can include gate spacers 114 and shallow trench isolation (STI) regions 116. FETs 100A and 100D can include etch stop layers (ESLs) 117 and ILD layers 118. ILD layers 118 can be disposed on ESLs 117. GAA FETs can further include inner spacers (not shown in FIGS. 1A and 1D). In some embodiments, gate spacers 114, inner spacers, STI regions 116, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$). In some embodiments, gate spacers 114 and inner spacers can have a thickness between about 2 nm and about 9 nm for adequate electrical isolation of gate structures 112A and 112B from adjacent structures.

Referring to FIGS. 1A and 1B, FET 100A can include ILD layer 118 above adjoining gate structures 112A and 112B (not visible in FIG. 1A). FET 100A can include metal ion capture layer 120 disposed within ILD layer 118 at or near the adjoining region of gate structures 112A and 112B. Metal ion capture layer 120 can include a fluorine-rich oxide layer, such as fluorine-doped metal oxide ($MO_x$) and fluorine-doped $SiO_x$. An oxide layer can be considered fluorine-rich if the oxide layer contains more than about 10% of F in at %. Metal ion capture layer 120 can have a thickness H1 between about 10 nm and about 20 nm, between about 5 nm and about 30 nm, and between about 2 nm and about 40 nm. If the thickness H1 is less than about 2 nm, metal ion capture layer 120 cannot effectively reduce the diffused metal ions. Reduction of the diffused metal ions is not effective if the metal ion concentration at or near the adjoining point of the gate structures with metal ion capture layer 120 is more than 75% of the metal ion concentration at or near the adjoining point of the gate structures without metal ion capture layer 120. If the thickness H1 is greater than about 40 nm, the manufacturing cost of forming metal ion capture layer 120 can be too high. Metal ion capture layer 120 can have a width W1 between about 40 nm and about 100 nm, between about 20 nm and about 150 nm, and between about 10 nm and about 200 nm. If the width W1 is less than about 10 nm, metal ion capture layer 120 cannot effectively reduce the diffused metal ions. Reduction of the diffused metal ions is not effective if the metal ion concentration at or near the adjoining point of the gate structures with metal ion capture layer 120 is more than 75% of the metal ion concentration at or near the adjoining point of the gate structures without metal ion capture layer 120. If the width W1 is greater than about 200 nm, the manufacturing cost of forming metal ion capture layer 120 can be too high.

Referring to FIG. 1C, the concentration of F with respect to width can be the highest at (or near) the center of metal ion capture layer 120 or at (or near) the center of adjoining point of gate structures 112A and 112B. F in metal ion capture layer 120 can diffuse toward two sides of metal ion capture layer 120 along the Y-axis. The concentration of F can decrease as the distance from the center of metal ion capture layer 120 increases. The concentration of Al with respect to width can be the highest in n-type WFM layer 126 because it is aluminum-rich TiAl and the lowest in p-type WFM layer 124 because it is Al-free TiN. A WFM alloy can be considered aluminum-rich if the WFM alloy contains more than about 10% of Al in at %. Al can diffuse and/or migrate from n-type WFM layer 126 to p-type WFM layer 124. At or near the adjoining point of gate structures 112A and 112B, Al can react with F from metal ion capture layer 120. For example, F and Al can react to form $AlF_3$. The reaction can reduce the concentration of Al. Because the concentration of F is the highest at (or near) the center of metal ion capture layer 120, the reaction is the strongest. Therefore, the concentration of Al can be the lowest at (or near) the center of metal ion capture layer 120. At or near the center of metal ion capture layer 120, the concentration of Al can be lower than that of n-type WFM layer 126 similarly because of the reaction. The reaction takes place and the concentration of Al decreases as metal ion capture layer 120 is being formed. In some embodiments, after the reaction, ILD layer 118 and metal ion capture layer 120 can be removed. In some embodiments, unlike as shown in FIG. 1A, ILD layer 118 and metal ion capture layer 120 do not exist in the final FET structures.

Referring to FIGS. 1D and 1E, FET 100D can include metal ion capture layer 121 disposed within gate structures 112A and 112B. As shown in FIG. 1E, metal ion capture layer 121 can be disposed within metal fill layer 130 at or near the adjoining region of gate structures 112A and 112B. Metal ion capture layer 121 can include dopants such as C, N, P, As, Sb, F, and combinations thereof within metal fill layer 130. Metal ion capture layer 121 can have a thickness H8 between about 4 nm and about 10 nm, between about 2 nm and about 15 nm, and between about 1 nm and about 20 nm. A ratio between H8 and H7 can be between about 0.2 and about 0.3, between about 0.15 and about 0.4, and between about 0.1 and about 0.5. If the thickness H8 is less than about 1 nm or if the ratio H8/H7 is less than about 0.1, metal ion capture layer 121 cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the thickness H8 is greater than about 20 nm or if the ratio H8/H7 is greater than about 0.5, the manufacturing cost of forming metal ion capture layer 121 can be too high. Metal ion capture layer 121 can have a width W2 between about 40 nm and about 100 nm, between about 20 nm and about 150 nm, and between about 10 nm and about 200 nm. If the width W2 is less than about 10 nm, metal ion capture layer 121 cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the width W2 is greater than about 200 nm, the manufacturing cost of forming metal ion capture layer 121 can be too high.

Referring to FIG. 1F, the concentration of the dopant atoms diffused and/or implanted in metal ion capture layer 121 can increase with depth first and then decrease. The most concentrated point with respect to depth can be shallower with ion implantation and can be deeper with diffusion. The concentration of the dopant atoms implanted at the most concentrated point can be greater than that diffused at the most concentrated point. The entire depth of implantation can be less than the entire depth of diffusion. In some embodiments, the concentration of the dopant atoms diffused and/or implanted in metal ion capture layer 121 can decrease with depth from the top surface of metal ion capture layer 121. In some embodiments, the concentration of the dopant atoms diffused and/or implanted in metal ion capture layer 121 can be substantially uniform. The concentration of the dopant atoms in metal ion capture layer 121 can range from about $1 \times 10^{20}$ atoms/cm$^3$ to about $3 \times 10^{22}$ atoms/cm$^3$, from about $0.8 \times 10^{20}$ atoms/cm$^3$ to about $3.3 \times 10^{22}$ atoms/cm$^3$, and from about $0.5 \times 10^{20}$ atoms/cm$^3$ to about $3.5 \times 10^{22}$ atoms/cm$^3$. If the concentration is less than about $0.5 \times 10^{20}$ atoms/cm$^3$, metal ion capture layer 121 cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the concentration is greater than about $3.5 \times 10^{22}$ atoms/cm$^3$, the manufacturing cost of forming metal ion capture layer 121 can be too high.

The concentration of the dopant atoms diffused and/or implanted in metal ion capture layer 121 can change with respect to width in a manner similar to the concentration change of F described with reference to FIG. 1C. The concentration of Al at or near the adjoining point of gate structures 112A and 112B can change with respect to width in a manner similar to the concentration change of Al described with reference to FIG. 1C, because Al can react with the dopant atoms from metal ion capture layer 121. For example, the dopant atoms and Al can react to form aluminum compounds. The reaction takes place and the concentration of Al decreases as metal ion capture layer 121 is being formed. In some embodiments, after the reaction, metal ion capture layer 121 can be removed. In some embodiments, unlike as shown in FIG. 1D, metal ion capture layer 121 does not exist in the final FET structures.

FIG. 1G illustrates a metal gate layout design in a semiconductor device. The semiconductor device can include n-type fin structures 106A and p-type fin structures 106B. The semiconductor device can include p-type gate structures 112A disposed on n-type fin structures 106A and n-type gate structures 112B disposed on p-type fin structures 106B. Area A illustrates the adjoining regions of p-type gate structures 112A and n-type gate structures 112B. Area A can include metal ion capture layers 120 or 121 (not shown in FIG. 1G). In some embodiments, the semiconductor device illustrated in FIG. 1G can be a ring oscillator. The ring oscillator can be used to provide a clock signal and benchmark device speed and power standby.

FIG. 1H illustrates a metal gate layout design in a semiconductor device. The semiconductor device can include n-type fin structures 106A and p-type fin structures 106B. The semiconductor device can include p-type gate structures 112A disposed on n-type fin structures 106A and n-type gate structures 112B disposed on p-type fin structures 106B. The semiconductor device can include cut metal gates 132. Cut metal gates 132 can include isolation structures between adjacent gate structures and therefore do not need metal ion capture layers 120 or 121. Area B illustrates the adjoining regions of p-type gate structures 112A and n-type gate structures 112B. Area B can include metal ion capture layers 120 or 121 (not shown in FIG. 1H). In some embodiments, the semiconductor device illustrated in FIG. 1H can be a 6-transistor (6T) static random access memory (SRAM). The 6T SRAM can be used to hold, read, and write data. The 6T SRAM can include pull-up (PU) transistors, pull-down (PD) transistors, and pass-gate (PG) transistors.

FIG. 1I illustrates a metal gate layout design in a semiconductor device. The semiconductor device can include n-type fin structures 106A and p-type fin structures 106B. The semiconductor device can include p-type gate structures 112A disposed on n-type fin structures 106A and n-type gate structures 112B disposed on p-type fin structures 106B. The semiconductor device can include cut metal gates 132. Cut metal gates 132 can include isolation structures between adjacent gate structures and therefore do not need metal ion capture layers 120 or 121. Areas C, D, E, and F illustrate the adjoining regions of p-type gate structures 112A and n-type gate structures 112B. Areas C, D, E, and F can include metal ion capture layers 120 or 121 (not shown in FIG. 1I). FIG. 1I illustrates the versatility of forming metal ion capture layers 120 or 121. A photolithography process can be used to pinpoint the adjoining regions where metal ion capture layers 120 or 121 are needed. Metal ion capture layers 120 or 121 can be formed at or near the adjoining regions of gate structures with different WFMs. Metal ion capture layers 120 or 121 can reduce leakage current caused by WFM ion drifting and/or migration and improve device performance.

Figure 2:
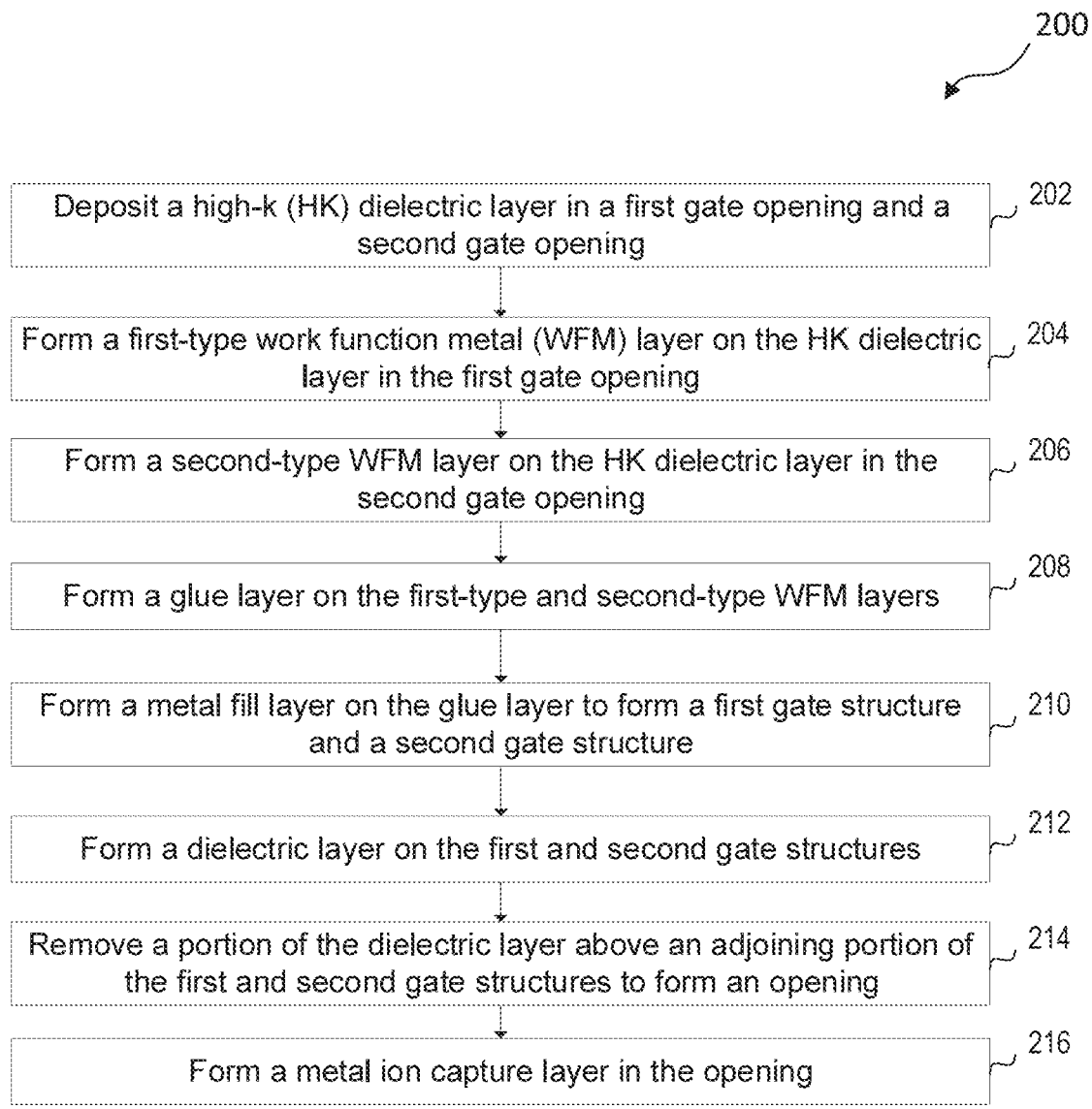
FIG. 2 is a flow diagram of a method for fabricating a semiconductor structure with a metal ion capture layer, in accordance with some embodiments.

According to some embodiments, FIG. 2 is a flow diagram describing a method 200 for fabricating FET 100A, as shown in FIGS. 1A and 1B. For illustrative purposes, the operations illustrated in FIG. 2 will be described with reference to the example fabrication process for fabricating FET 100A as illustrated in FIGS. 3-10. FIGS. 3-10 are cross-sectional views of FET 100A along line A-A of FIG. 1A at various stages of fabrication, according to some embodiments. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. Elements in FIGS. 3-10 with the same annotations as elements in FIGS. 1A and 1B are described above.

It should be noted that method 200 may not produce a complete FET 100A. Accordingly, it is understood that additional processes can be provided before, during, and after method 200, and that some other processes may only be briefly described herein. For example, in some embodiments, fin structures can be patterned by a photolithography process on a semiconductor substrate. Polysilicon structures can be deposited by a CVD process over the fin structures and patterned by a photolithography process. Spacers can be deposited by a CVD process on the polysilicon structures. Portions of the fin structures can be removed by a dry etch process to form S/D openings, and S/D regions can be epitaxially grown in the S/D openings. In GAA FETs, inner spacers can be deposited by a CVD process prior to the S/D region formation. The polysilicon structures can then be removed by a dry etch process to form gate openings and metal gate structures can be formed in the gate openings.

Figure 3:
FIGS. 3-10 illustrate cross-sectional views of a semiconductor structure with a metal ion capture layer at various stages of its fabrication process, in accordance with some embodiments.

Referring to FIG. 2, in operation 202, a HK dielectric layer is deposited in a first gate opening and a second gate opening. For example, as shown in FIG. 3, HK dielectric layer 122 can be formed in first gate opening 302 and second gate opening 304. First and second gate openings 302 and 304 are not shown with sidewalls in FIG. 3. First and second gate openings 302 and 304 adjoin each other. In some embodiments, first gate opening 302 can be used to form a p-type metal gate with a p-type WFM and second gate opening 304 can be used to form an n-type metal gate with an n-type WFM. HK dielectric layer 122 can be deposited by a CVD process or a PVD process. In some embodiments, an IO layer (not shown in FIG. 3) can be formed by a CVD process or a PVD process in first and second gate openings 302 and 304.

Figure 4:
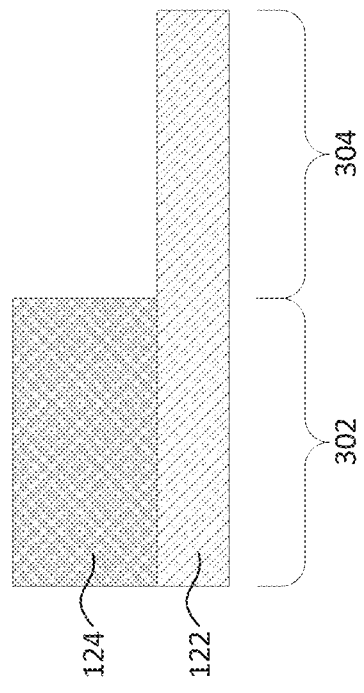

Referring to FIG. 2, in operation 204, a first-type WFM layer is formed on the HK dielectric layer in the first gate opening. For example, as shown in FIG. 4, p-type WFM layer 124 can be formed on HK dielectric layer 122 in first gate opening 302. P-type WFM layer 124 can be selectively formed in first gate opening 302 and not in second gate opening 304 by a photolithography patterning process. P-type WFM layer 124 can be formed by a CVD process, a PVD process, or a metal-organic chemical vapor deposition (MOCVD) process.

Figure 5:
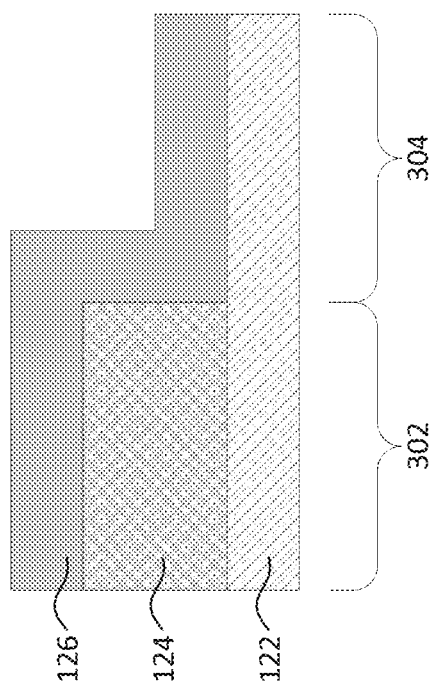

Referring to FIG. 2, in operation 206, a second-type WFM layer is formed on the HK dielectric layer in the second gate opening. In some embodiments, the second-type WFM layer is formed on the HK dielectric layer both in the first and second gate openings. For example, as shown in FIG. 5, n-type WFM layer 126 can be formed on p-type WFM layer 124 in first gate opening 302 and on HK dielectric layer 122 in second gate opening 304. N-type WFM layer 126 can be formed by a CVD process, a PVD process, or a MOCVD process.

Figure 6:
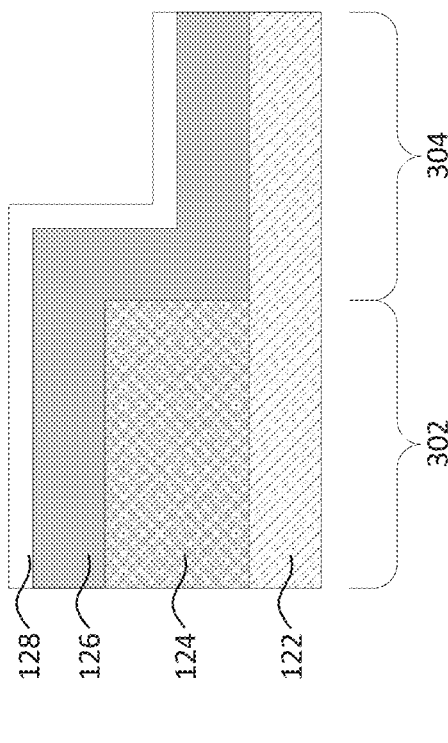

Referring to FIG. 2, in operation 208, a glue layer is formed on the first-type WFM layer and the second-type WFM layer. In some embodiments, the glue layer is formed on the second-type WFM layer where the second-type WFM layer covers the first-type WFM layer. For example, as shown in FIG. 6, glue layer 128 can be formed on n-type WFM layer 126 in first and second gate openings 302 and 304. Glue layer 128 can be formed by a CVD process, a PVD process, a MOCVD process, or an ALD process.

Figure 7:
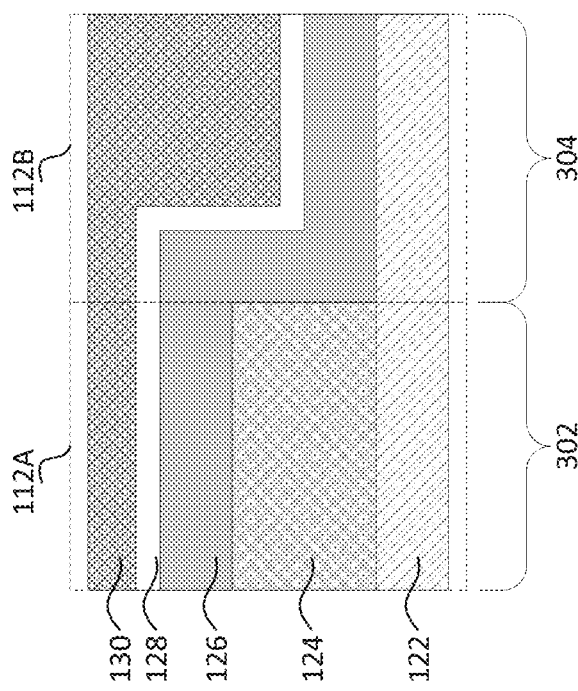

Referring to FIG. 2, in operation 210, a metal fill layer is formed on the glue layer to form a first gate structure and a second gate structure. For example, as shown in FIG. 7, metal fill layer 130 can be formed on glue layer 128 in first and second gate openings 302 and 304 to form first gate structure 112A and second gate structures 112B. First and second gate structures 112A and 112B adjoin each other. In some embodiments, first gate structure 112A can be a p-type metal gate with p-type WFM layer 124 and second gate structure 112B can be an n-type metal gate with n-type WFM layer 126. Metal fill layer 130 can be formed by a CVD process, a PVD process, or a MOCVD process.

Figure 8:
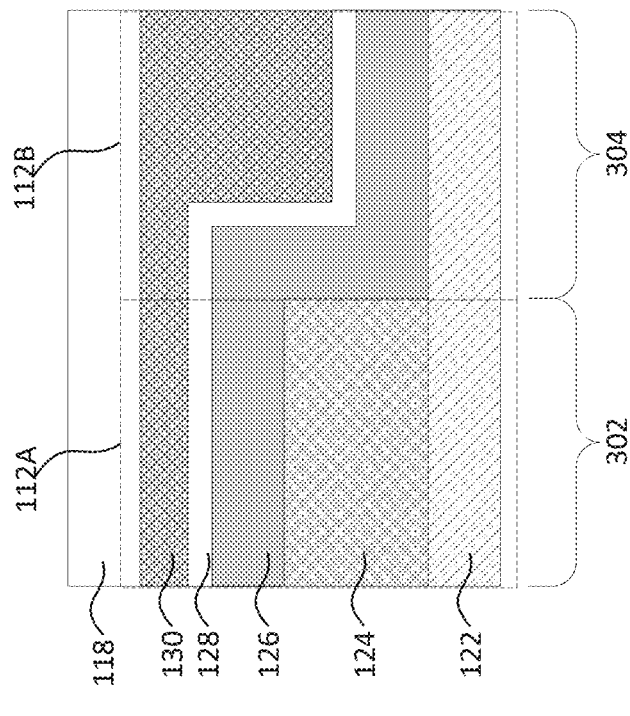

Referring to FIG. 2, in operation 212, a dielectric layer is formed on the first and second gate structures. For example, as shown in FIG. 8, ILD layer 118 can be formed on metal fill layer 130 on first and second gate structures 112A and 112B. ILD layer 118 can be formed by a CVD process or a PVD process.

Figure 9:
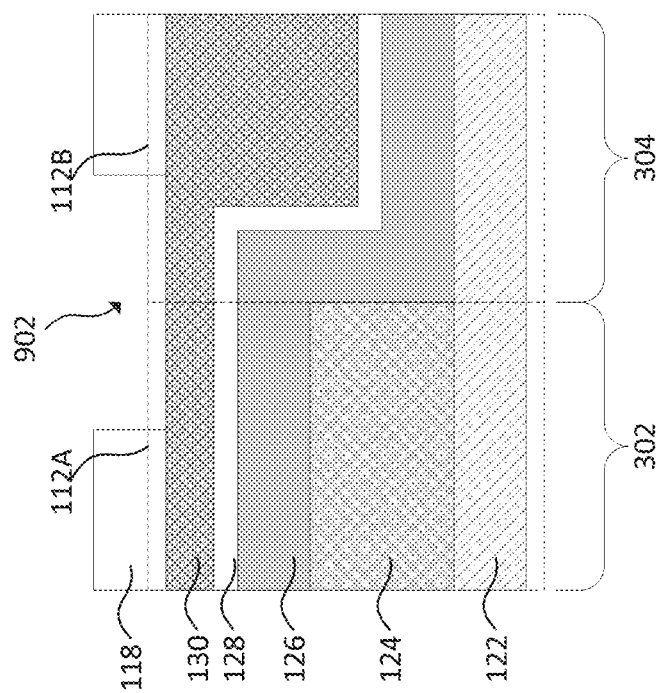
Figure 9:
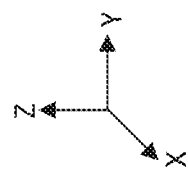

Referring to FIG. 2, in operation 214, a portion of the dielectric layer above an adjoining portion of the first and second gate structures is removed to form an opening. For example, as shown in FIG. 9, opening 902 can be formed in ILD layer 118 to expose an adjoining region of first and second gate structures 112A and 112B. In some embodiments, opening 902 can be formed by a dry etch process (e.g., reactive ion etch process) using fluorocarbon ($C_xF_y$) gas having a flow rate ranging from about 100 sccm to about 400 sccm. The etch process can be carried out for a period of time ranging from about 10 seconds to about 90 seconds at a temperature ranging from about 10° C. to about 90° C., under a pressure ranging from about 15 mTorr to about 100 mTorr. The etch conditions can depend on the size of opening 902. The etch process can have a higher etch rate in the vertical direction (e.g., Z-direction) than in the horizontal direction (e.g., Y-direction). The etch process can have a higher etch rate near the top of opening 902 than near the bottom of opening 902. In some embodiments, opening 902 can be formed by a wet etch process using hydrogen peroxide at a temperature ranging from about 30° C. to about 100° C. In some embodiments, the wet etch process can include a diluted solution of hydrogen fluoride (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and combinations thereof. The etch process can be a timed etch.

Figure 10:
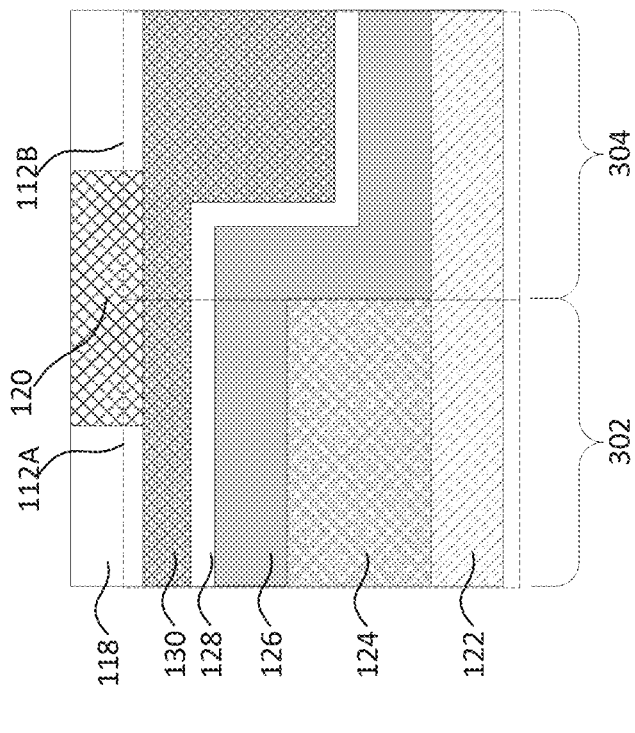
Figure 10:
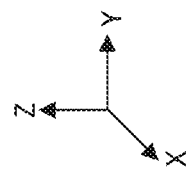

Referring to FIG. 2, in operation 216, a metal ion capture layer is formed in the opening. For example, as shown in FIG. 10, metal ion capture layer 120 can be formed in opening 902 above the adjoining region between first and second gate structures 112A and 112B. Metal ion capture layer 120 can be formed by a CVD process. In some embodiments, the CVD process can use a precursor mixture of a metal-organic compound, oxygen, fluorine or a fluorine-containing compound, and an inert carrier gas. In some embodiments, the CVD process can use a precursor mixture of hexachlorodisilane (HCDS), oxygen, fluorine or a fluorine-containing compound, and an inert carrier gas. In some embodiments, the CVD process can be carried out for a period of time ranging from about 10 seconds to about 150 seconds at a temperature ranging from about 20° C. to about 200° C., under a pressure ranging from about 30 Torr to about 150 Torr. In some embodiments, the CVD process can be carried out in atmospheric pressure. If the deposition time is less than about 10 seconds, or the temperature is less than about 20° C., or the pressure is less than about 30 Tory, metal ion capture layer 120 deposited can be too thin and cannot effectively reduce the diffused metal ions. Reduction of the diffused metal ions is not effective if the metal ion concentration at or near the adjoining point of the gate structures with metal ion capture layer 120 is more than 75% of the metal ion concentration at or near the adjoining point of the gate structures without metal ion capture layer 120. If the deposition time is greater than about 150 seconds, or the temperature is greater than about 200° C., or the pressure is greater than about 150 Torr, the manufacturing cost of forming metal ion capture layer 120 can be too high. Metal ion capture layers 120 can reduce leakage current caused by WFM ion drifting and/or migration and improve device performance.

Figure 11:
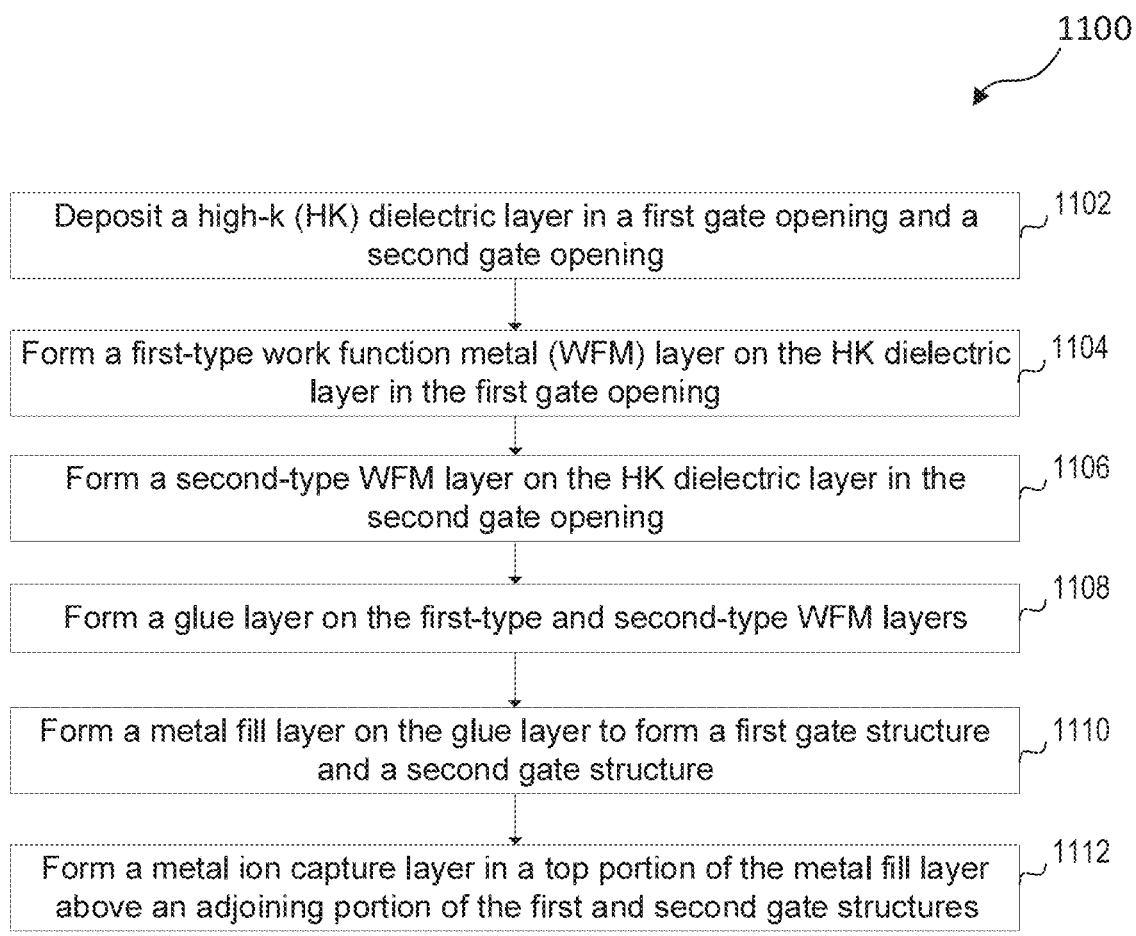
FIG. 11 is a flow diagram of another method for fabricating a semiconductor structure with a metal ion capture layer, in accordance with some embodiments.

According to some embodiments, FIG. 11 is a flow diagram describing a method 1100 for fabricating FET 100D, as shown in FIGS. 1D and 1E. For illustrative purposes, the operations illustrated in FIG. 11 will be described with reference to the example fabrication process for fabricating FET 100D as illustrated in FIGS. 12-18. FIGS. 12-18 are cross-sectional views of FET 100D along line B-B of FIG. 1D at various stages of fabrication, according to some embodiments. Additional fabrication operations can be performed between the various operations of method 1100 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 11. Elements in FIGS. 12-18 with the same annotations as elements in FIGS. 1D and 1E are described above. It should be noted that method 1100 may not produce a complete FET 100D. Accordingly, it is understood that additional processes can be provided before, during, and after method 1100, and that some other processes may only be briefly described herein.

Referring to FIG. 11, in operation 1102, a HK dielectric layer is deposited in a first gate opening and a second gate opening. For example, as shown in FIG. 12, HK dielectric layer 122 can be formed in first gate opening 302 and second gate opening 304. First and second gate openings 302 and 304 are not shown with sidewalls in FIG. 12. HK dielectric layer 122 can be formed in a manner similar to that described with reference to FIG. 3 and operation 202 of FIG. 2.

Referring to FIG. 11, in operation 1104, a first-type WFM layer is formed on the HK dielectric layer in the first gate opening. For example, as shown in FIG. 13, p-type WFM layer 124 can be formed on HK dielectric layer 122 in first gate opening 302. P-type WFM layer 124 can be formed in a manner similar to that described with reference to FIG. 4 and operation 204 of FIG. 2.

Figure 14:
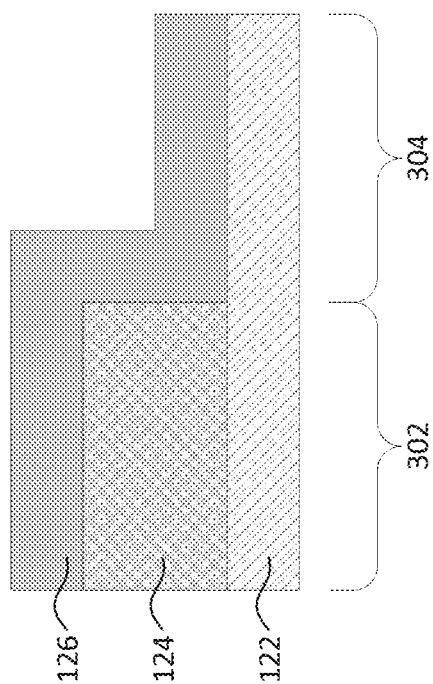
Figure 14:
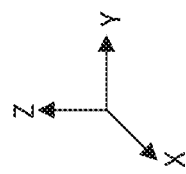

Referring to FIG. 11, in operation 1106, a second-type WFM layer is formed on the HK dielectric layer in the second gate opening. In some embodiments, the second-type WFM layer is formed on the HK dielectric layer both in the first and second gate openings. For example, as shown in FIG. 14, n-type WFM layer 126 can be formed on p-type WFM layer 124 in first gate opening 302 and on HK dielectric layer 122 in second gate opening 304. N-type WFM layer 126 can be formed in a manner similar to that described with reference to FIG. 5 and operation 206 of FIG. 2.

Figure 15:
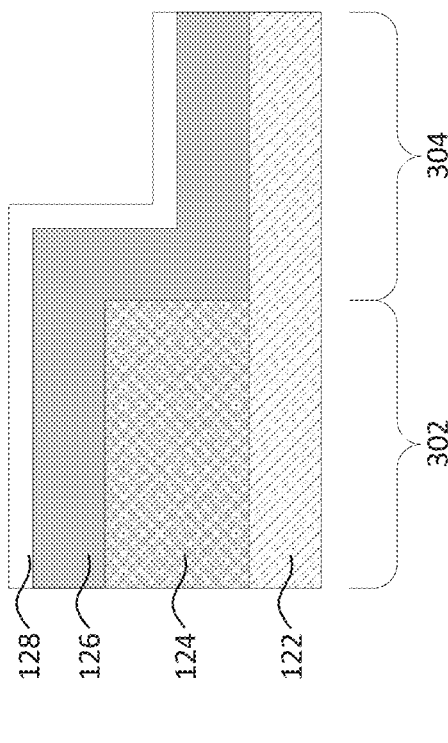
Figure 15:
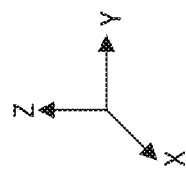

Referring to FIG. 11, in operation 1108, a glue layer is formed on the first-type WFM layer and the second-type WFM layer. In some embodiments, the glue layer is formed on the second-type WFM layer where the second-type WFM layer covers the first-type WFM layer. For example, as shown in FIG. 15, glue layer 128 can be formed on n-type WFM layer 126 in first and second gate openings 302 and 304. Glue layer 128 can be formed in a manner similar to that described with reference to FIG. 6 and operation 208 of FIG. 2.

Figure 16:
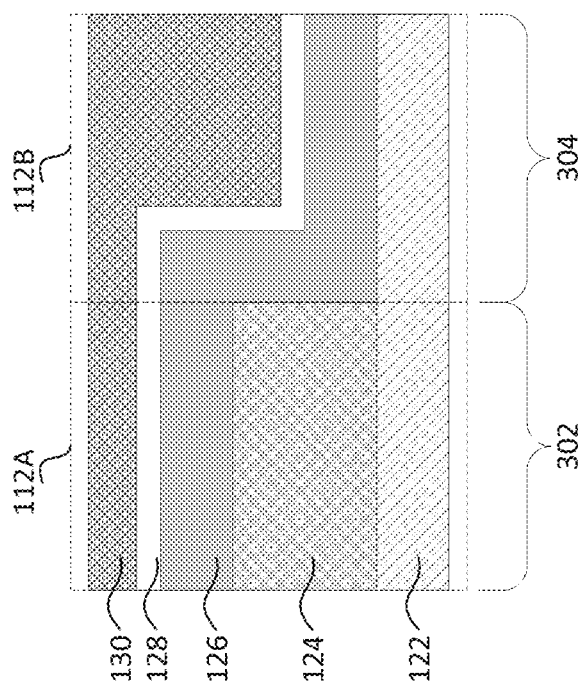
Figure 16:
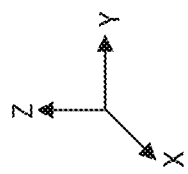

Referring to FIG. 11, in operation 1110, a metal fill layer is formed on the glue layer to form a first gate structure and a second gate structure. For example, as shown in FIG. 16, metal fill layer 130 can be formed on glue layer 128 in first and second gate openings 302 and 304 to form first gate structure 112A and second gate structure 112B. First and second gate structures 112A and 112B adjoin each other. In some embodiments, first gate structure 112A can be a p-type metal gate with p-type WFM layer 124 and second gate structure 112B can be an n-type metal gate with n-type WFM layer 126. Metal fill layer 130 can be formed in a manner similar to that described with reference to FIG. 7 and operation 210 of FIG. 2.

Figure 17:
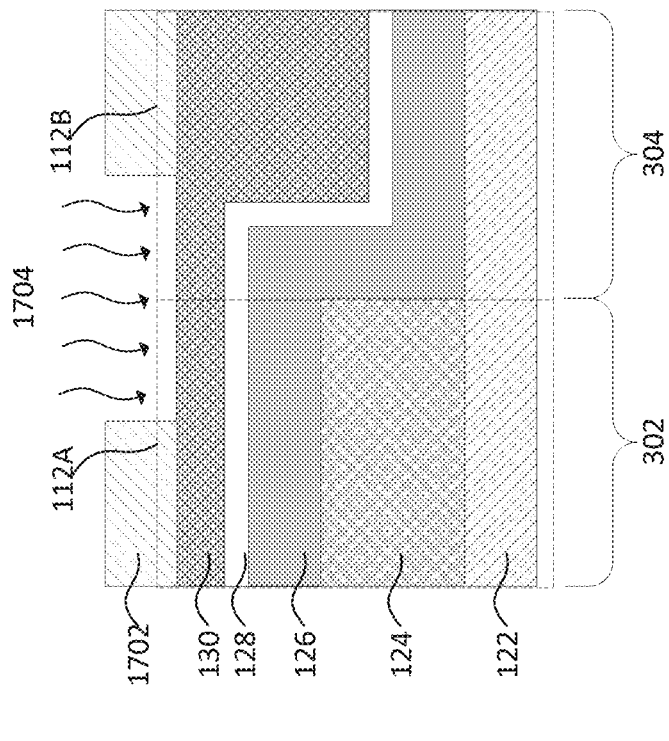
Figure 17:
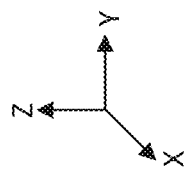
Figure 18:
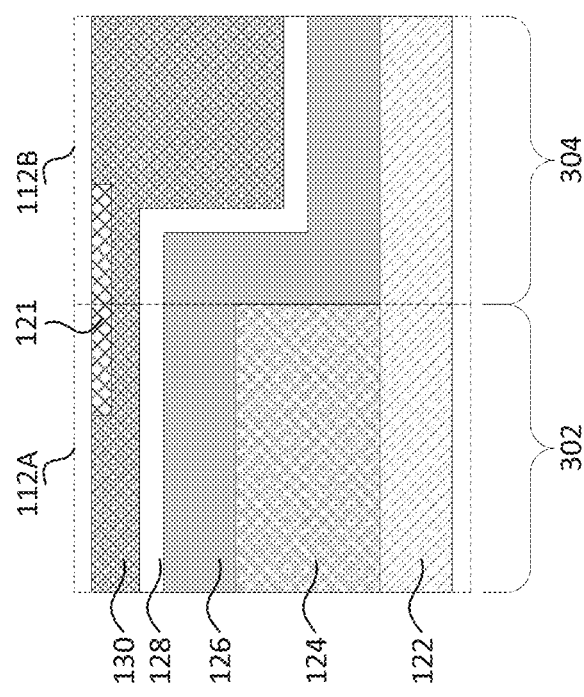

Referring to FIG. 11, in operation 1112, a metal ion capture layer is formed in a top portion of the metal fill layer above an adjoining portion of the first and second gate structures. For example, as shown in FIG. 17, a photoresist layer 1702 can be spin coated on metal fill layer 130. An opening 1704 above an adjoining region of first and second gate structures 112A and 112B can be formed by transferring a pattern of a photomask, such as a reticle, to photoresist layer 1702 by an exposure process and a develop process. Opening 1704 can be exposed to a thermal diffusion process, an ALD diffusion process, a wet diffusion process, or an ion implantation process. In some embodiments, the ion implantation process can be plasma enhanced. As shown in FIG. 18, after the diffusion process or the ion implantation process, metal ion capture layer 121 can be formed in a top portion of metal fill layer 130 above the adjoining region of first and second gate structures 112A and 112B.

In some embodiments, metal ion capture layer 121 can be formed by a thermal diffusion process. In some embodiments, the thermal diffusion process can use a dopant gas containing C, N, P, As, Sb, F, and combinations thereof. For example, the dopant gas can include arsine ($AsH_3$), phosphine ($PH_3$), sulfur hexafluoride ($SF_6$), bromotrifluoromethane ($CBrF_3$), and combinations thereof. In some embodiments, the thermal diffusion process can be carried out at a temperature ranging from about 50° C. to about 300° C., from about 30° C. to about 400° C., and from about 20° C. to about 500° C. If the temperature is less than about 20° C., metal ion capture layer 121 diffused into metal fill layer 130 can be too thin and cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the temperature is greater than about 500° C., the manufacturing cost of forming metal ion capture layer 121 can be too high. In some embodiments, metal ion capture layer 121 can be formed by an ALD diffusion process or a wet diffusion process.

In some embodiments, metal ion capture layer 121 can be formed by an ion implantation process. In some embodiments, the ion implantation process can include dopant species containing C, N, P, As, Sb, F, and combinations thereof. In some embodiments, the ion implantation process can use an incident angle of about 0°. The ion beam energy can be between about 1 keV and about 10 keV, between about 0.8 keV and about 12 keV, and between about 0.5 keV and about 15 keV. The dose of the dopant species can be between about $1\times10^{12}$ ions/cm$^2$ and about $1\times10^{15}$ ions/cm$^2$, between about $0.8\times10^{12}$ ions/cm$^2$ and about $1.2\times10^{15}$ ions/cm$^2$, and between about $0.5\times10^{12}$ ions/cm$^2$ and about $1.5\times10^{15}$ ions/cm$^2$. If the ion beam energy is less than about 0.5 keV or the dose of the dopant species is less than about $0.5\times10^{12}$ ions/cm$^2$, metal ion capture layer 121 implanted in metal fill layer 130 can be too thin and cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the ion beam energy is greater than about 15 keV or the dose of the dopant species is greater than about $1.5\times10^{15}$ ions/cm$^2$, the manufacturing cost of forming metal ion capture layer 121 can be too high.

In some embodiments, the ion implantation process can be plasma enhanced. The enhanced ion implantation process can be carried out with a power ranging from about 500 V to about 1000 V, under a pressure ranging from about 1 mTorr to about 100 mTorr. If the power is less than about 500 V or the pressure is less than about 1 mTorr, metal ion capture layer 121 implanted in metal fill layer 130 can be too thin and cannot effectively reduce the diffused metal ions. Reduction of the diffused metal ions is not effective if the metal ion concentration at or near the adjoining point of the gate structures with metal ion capture layer 121 is more than 75% of the metal ion concentration at or near the adjoining point of the gate structures without metal ion capture layer 121. If the power is greater than about 1000 V or the pressure is greater than about 100 mTorr, the manufacturing cost of forming metal ion capture layer 121 can be too high. Metal ion capture layers 121 can reduce leakage current caused by WFM ion drifting and/or migration and improve device performance.

The present disclosure provides example FET structures (e.g., FETs 100A and 100D, GAA FETs, finFETs, or planar FETs) with metal ion capture layers (e.g., metal ion capture layers 120 and 121) in a semiconductor device and/or in an IC and example methods (e.g., methods 200 and 1100) for fabricating the same. In some embodiments, a metal ion capture layer (e.g., metal ion capture layer 120) can be formed in an interlayer dielectric (ILD) layer (e.g., ILD layer 118) above adjoining metal gates with different WFMs. An opening (e.g., opening 902) can be formed in the ILD layer by a dry etch process or a wet etch process. The metal ion capture layer can be formed by depositing a fluorine-rich oxide layer in the opening with a physical vapor deposition (PVD) process or a chemical vapor deposition (CVD) process. An oxide layer can be considered fluorine-rich if the oxide layer contains more than about 10% of F in at %. The fluorine in the fluorine-rich oxide layer can react with metal ions diffused from the higher-concentration side of the WFMs to the lower-concentration side, therefore reducing the metal drifting and/or migration. For example, fluorine (F) and aluminum (Al) can react to form aluminum fluoride ($AlF_3$). The reaction can take place while the fluorine-rich oxide layer is being deposited. In some embodiments, after the reaction, the fluorine-rich oxide layer can remain in the ILD layer. In some embodiments, the fluorine-rich oxide layer can be removed after the reaction.

In some embodiments, a metal ion capture layer (e.g., metal ion capture layer 121) can be formed in a metal fill layer (e.g., metal fill layer 130) of adjoining metal gates with different WFMs. In some embodiments, the metal ion capture layer can be formed by diffusing C, N, P, As, Sb, F, and combinations thereof in the metal fill layer by a thermal diffusion process, an ALD diffusion process, or a wet diffusion process. In some embodiments, the metal ion capture layer can be formed by implanting C, N, P, As, Sb, F, and combinations thereof in the metal fill layer by an ion implantation process. In some embodiments, the ion implantation process can be plasma enhanced. The area to be diffused or implanted can be defined by a photoresist layer (e.g., photoresist layer 1702). The C, N, P, As, Sb, F, and combinations thereof in the metal ion capture layer can react with metal ions diffused from the higher-concentration side of the WFMs to the lower-concentration side, therefore reducing the metal drifting and/or migration. For example, C, N, P, As, Sb, F, and Al can react to form aluminum compounds. The reaction can take place while the metal ion capture layer is being formed. In some embodiments, after the reaction, the metal ion capture layer can remain in the metal fill layer. In some embodiments, the metal ion capture layer can be removed after the reaction. The metal ion capture layer can reduce metal drifting and/or migration, decrease leakage current in the adjoining metal gates with different WFMs, and improve device performance.

In some embodiments, a method includes forming a first fin structure and a second fin structure on a substrate and forming a first gate structure over the first fin structure and a second gate structure over the second fin structure, where the first gate structure adjoins the second gate structure. The method further includes forming a dielectric layer on the first and second gate structures, removing a portion of the dielectric layer above an adjoining portion of the first and second gate structures to form an opening, and forming a metal ion capture layer in the opening.

In some embodiments, a method includes forming a first gate structure, where forming the first gate structure includes forming a first-type work function metal (WFM) layer and a metal fill layer. The method further includes forming a second gate structure adjoining the first gate structure, where forming the second gate structure includes forming a second-type WFM layer and the metal fill layer, and where the second-type WFM layer is different from the first-type WFM layer. The method further includes forming a mask layer with an opening above an adjoining portion of the first and second gate structures, forming a metal ion capture layer in a top portion of the metal fill layer exposed by the opening, and removing the mask layer.

In some embodiments, a structure includes a first fin structure and a second fin structure on a substrate and a first gate structure over the first fin structure, the first gate structure including a first-type work function metal (WFM) layer and a metal fill layer. The structure further includes a second gate structure over the second fin structure and adjoining the first gate structure, the second gate structure including a second-type WFM layer, where the second-type WFM layer is different from the first-type WFM layer, and the metal fill layer. The structure further includes a metal ion capture layer in a top portion of the metal fill layer above an adjoining portion of the first and second gate structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first fin structure and a second fin structure on a substrate;
   forming a first gate structure over the first fin structure and a second gate structure over the second fin structure, wherein the first gate structure adjoins the second gate structure;
   forming a dielectric layer on the first and second gate structures;
   removing a portion of the dielectric layer above an adjoining portion of the first and second gate structures to form an opening; and
   forming a metal ion capture layer in the opening.

2. The method of claim 1, wherein forming the first and second gate structures comprises forming an interfacial oxide (IO) layer and a high-k (HK) dielectric layer on the IO layer.

3. The method of claim 1, wherein forming the first gate structure comprises forming a first-type work function metal (WFM) layer and a metal fill layer, and wherein forming the second gate structure comprises forming a second-type, different from the first-type, WFM layer and the metal fill layer.

4. The method of claim 3, wherein forming the first and second gate structures further comprises forming a glue layer on the first-type and second-type WFM layers.

5. The method of claim 1, wherein forming the first gate structure comprises forming an aluminum-free WFM layer, and wherein forming the second gate structure comprises forming an aluminum-rich WFM layer.

6. The method of claim 1, wherein removing the portion of the dielectric layer comprises etching the portion of the dielectric layer by a dry etch process or a wet etch process.

7. The method of claim 1, wherein forming the metal ion capture layer comprises depositing a fluorine-rich oxide layer in the opening by a chemical vapor deposition (CVD) process or a physical vapor deposition (PVD) process.

8. The method of claim 1, wherein forming the metal ion capture layer comprises forming a fluorine-rich oxide layer with a width of at least about 50 nm.

9. The method of claim 1, wherein forming the metal ion capture layer comprises reacting the metal ion capture layer with metal ions diffused from a WFM layer of the second gate structure.

10. The method of claim 1, wherein forming the metal ion capture layer comprises reducing an aluminum concentration in the adjoining portion of the first and second gate structures.

11. A method, comprising:
    forming a first gate structure, wherein forming the first gate structure comprises forming a first-type work function metal (WFM) layer and a metal fill layer;
    forming a second gate structure adjoining the first gate structure, wherein forming the second gate structure comprises forming a second-type WFM layer and the metal fill layer, and wherein the second-type WFM layer is different from the first-type WFM layer;
    forming a mask layer with an opening above an adjoining portion of the first and second gate structures;
    forming a metal ion capture layer in a top portion of the metal fill layer exposed by the opening; and
    removing the mask layer.

12. The method of claim 11, wherein forming the first-type WFM layer comprises forming an aluminum-free WFM layer, and wherein forming the second-type WFM layer comprises forming an aluminum-rich WFM layer.

13. The method of claim 11, wherein forming the metal ion capture layer comprises diffusing carbon (C), nitrogen (N), phosphorous (P), arsenic (As), antimony (Sb), fluorine (F), and combinations thereof in the metal fill layer by a thermal diffusion process, an atomic layer deposition (ALD) diffusion process, or a wet diffusion process.

14. The method of claim 11, wherein forming the metal ion capture layer comprises implanting C, N, P, As, Sb, F, and combinations thereof in the metal fill layer by an ion implantation process or a plasma enhanced ion implantation process.

15. The method of claim 11, wherein forming the metal ion capture layer comprises reacting the metal ion capture layer with metal ions diffused from the second-type WFM layer of the second gate structure.

16. The method of claim 11, wherein forming the metal ion capture layer comprises reducing an aluminum concentration in the adjoining portion of the first and second gate structures.

17. A method, comprising:
    forming a first fin structure and a second fin structure on a substrate;
    forming a first gate structure over the first fin structure and a second gate structure over the second fin structure;
    forming a dielectric layer on the first and second gate structures;
    removing a portion of the dielectric layer to form an opening; and
    forming a metal ion capture layer in the opening.

18. The method of claim 17, wherein forming the first and second gate structures comprises forming an interfacial oxide (IO) layer and a high-k (HK) dielectric layer on the IO layer.

19. The method of claim 17, wherein forming the first gate structure comprises forming a first-type work function metal (WFM) layer and a metal fill layer, and wherein forming the second gate structure comprises forming a second-type WFM layer different from the first-type WFM layer and the metal fill layer.

20. The method of claim 17, wherein removing the portion of the dielectric layer comprises etching the portion of the dielectric layer by a dry etch process or a wet etch process.

* * * * *

UNITED STATES PATENT AND TRADEMARK OFFICE
CERTIFICATE OF CORRECTION

| | | |
|---|---|---|
| PATENT NO. | : 12,336,256 B2 | Page 1 of 1 |
| APPLICATION NO. | : 17/720481 | |
| DATED | : June 17, 2025 | |
| INVENTOR(S) | : Liao et al. | |

It is certified that error appears in the above-identified patent and that said Letters Patent is hereby corrected as shown below:

In the Specification

In Column 4, Line 12, delete "1G-II" and insert -- 1G-1I --, therefor.

In Column 11, Line 31, delete "30 Tory," and insert -- 30 Torr, --, therefor.

Signed and Sealed this
Twenty-eighth Day of October, 2025

John A. Squires
*Director of the United States Patent and Trademark Office*